United States Patent
Nadimpalli et al.

(10) Patent No.: US 8,791,760 B2
(45) Date of Patent: Jul. 29, 2014

(54) CLOSED LOOP BIAS CONTROL

(75) Inventors: Praveen Varma Nadimpalli, Chandler, AZ (US); Mike Landherr, Gilbert, AZ (US); Michael B. Thomas, Chandler, AZ (US); Wonseok Oh, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 76 days.

(21) Appl. No.: 13/529,177

(22) Filed: Jun. 21, 2012

(65) Prior Publication Data
US 2012/0326778 A1 Dec. 27, 2012

Related U.S. Application Data

(60) Provisional application No. 61/499,224, filed on Jun. 21, 2011.

(51) Int. Cl.
*H03F 3/04* (2006.01)
(52) U.S. Cl.
USPC .............................. 330/296; 330/285; 330/297
(58) Field of Classification Search
USPC .......... 330/296–297, 285, 289, 127, 279, 134
See application file for complete search history.

(56) References Cited

U.S. PATENT DOCUMENTS

| | | | |
|---|---|---|---|
| 6,233,440 B1 | 5/2001 | Taylor | |
| 6,614,309 B1 * | 9/2003 | Pehlke | 330/296 |
| 6,701,138 B2 | 3/2004 | Epperson et al. | |
| 7,109,897 B1 | 9/2006 | Levesque | |

* cited by examiner

*Primary Examiner* — Hieu Nguyen
(74) *Attorney, Agent, or Firm* — Withrow & Terranova, P.L.L.C.

(57) ABSTRACT

This disclosure relates to radio frequency (RF) amplification devices and methods for amplifying an RF input signal. To set the quiescent operating level of the RF output signal, a bias signal to be applied to the RF input signal is received prior to amplifying the RF input signal. The bias signal is amplified to generate the RF output signal at the quiescent operating level and a feedback signal is received that is indicative of the quiescent operating level of the RF output signal. Prior to amplifying the RF input signal, the bias signal level of the bias signal is adjusted such that the quiescent operating level is set to a reference signal level based on the feedback signal level. This allows for adjustments to be made to the quiescent operating level and maintain the quiescent operating level at a desired value.

16 Claims, 7 Drawing Sheets

CLOSED LOOP BIAS CONTROL

RELATED APPLICATIONS

This application claims the benefit of provisional patent application Ser. No. 61/499,224, filed Jun. 21, 2011, the disclosure of which is hereby incorporated herein by reference in its entirety.

FIELD OF THE DISCLOSURE

This disclosure relates to radio frequency (RF) amplification devices for RF input signals and methods of operating the same.

BACKGROUND

Many electronic devices include or are connected to amplification devices that amplify input signals and generate amplified output signals. As is well known in the art, these amplification devices may increase or decrease a signal level of the input signal in accordance with a gain. To place the input signal within an operating range of the amplification device, a bias signal is applied to the input signal. Generally, the bias signal is a DC signal that shifts the input signal into the operating range of the amplification device. A quiescent operating level of the amplified output signal is thus determined in accordance with the bias signal level of the bias signal.

Ideally, the quiescent operating level of the input signal remains consistent and does not change. Furthermore, under ideal circumstances, the quiescent operating level is consistent so that amplification devices in a manufactured population of amplification devices have the same quiescent operating level. However, in practice, this is not generally the case. First, the quiescent operating level of the amplification device can drift. For example, transistors in the amplification device may heat up resulting in change to the quiescent operating level during operation of the amplification device. Second, process variations in the manufacturing of the amplification device can result in variations in the quiescent operating level. The drift and manufacturing variations lead to various inefficiencies such as loss of linearity, noise, a decrease in the Adjacent Channel Power Ratio (ACPR), a decrease in Power Added Efficiency (PAE), and/or the like.

Therefore, RF amplification devices and methods are needed that reduce, compensate for, or eliminate inefficiencies resulting from drifts and manufacturing variations in the quiescent operating level.

SUMMARY

This disclosure relates to radio frequency (RF) amplification devices and methods for amplifying an RF input signal. In one embodiment, a method of providing a quiescent operating level of an RF output signal generated by amplification of the RF input signal is disclosed. To set the quiescent operating level of the RF output signal, a bias signal to be applied to the RF input signal is received prior to amplifying the RF input signal. The bias signal is amplified to generate the RF output signal at the quiescent operating level. A feedback signal is then received that is indicative of the quiescent operating level of the RF output signal. Prior to amplifying the RF input signal, the bias signal level of the bias signal is adjusted such that the quiescent operating level is set to a reference signal level based on the feedback signal level. In this manner, the quiescent operating level can be adjusted to compensate for changes in the quiescent operating level resulting from drift. Furthermore, the quiescent operating level can be set closer to a desired operating level to correct for errors resulting from manufacturing variations in the quiescent operating level.

In another embodiment, an RF amplification device is disclosed. The amplification device includes an amplification circuit and a biasing circuit. The amplification circuit is configured to amplify an RF input signal. From the RF input signal, the amplification circuit generates the RF output signal. To provide the RF input signal within an operating range of the amplification circuit, the biasing circuit is operably associated with the amplification circuit to apply the bias signal to the RF input signal. Accordingly, the RF output signal has a quiescent operating level set in accordance with a bias signal level of the bias signal.

The biasing circuit is operable to generate the bias signal in an adjustment enable mode and in an adjustment disable mode. In the adjustment enable mode, the bias circuit is configured to adjust the bias signal level of the bias signal such that the quiescent operating level is set to a reference signal level. In contrast, the bias circuit is configured to maintain the bias signal level of the bias signal when the biasing circuit is operating in the adjustment disable mode. As a result, the quiescent operating level can be adjusted to compensate for changes from drift or due to manufacturing variations in the quiescent operating level during the adjustment enable mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
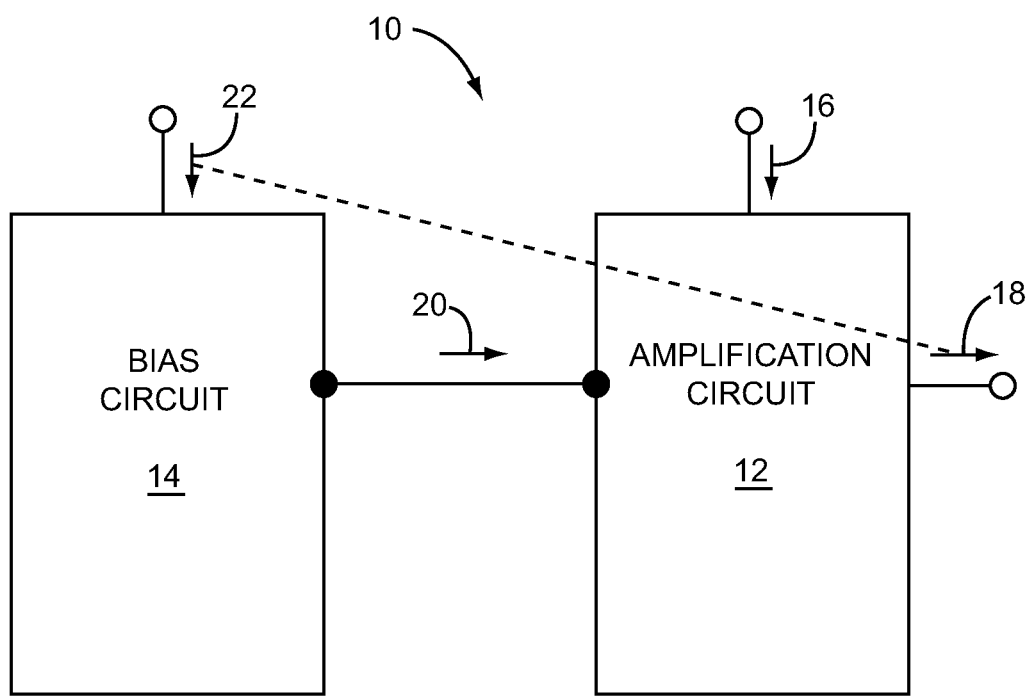
FIG. 1 illustrates a block diagram of one embodiment of a RF amplification device configured to amplify an RF input signal using a supply voltage.

FIG. 1 illustrates a block diagram of one embodiment of a radio frequency (RF) amplification device 10. The RF amplification device 10 includes an amplification circuit 12 and a bias circuit 14. The amplification circuit 12 is configured to amplify an RF input signal 16 and generate an RF output signal 18 from the RF input signal 16. To provide the RF input signal 16 within an operating range of the amplification circuit 12, the bias circuit 14 generates a bias signal 20 at a bias signal level. As shown in FIG. 1, the bias circuit 14 is operably associated with the amplification circuit 12 to apply the bias signal 20 to the RF input signal 16. By applying the bias signal 20 to the RF input signal 16, the RF output signal 18 has a quiescent operating level set in accordance with the bias signal level of the bias signal 20.

The RF input signal 16 and RF output signal 18 may be any type of signal or combination of signals, such as radio frequency (RF) signals, voltage signals, current signals, power signals, and/or digital signals. To generate the RF input signal 16 from the RF output signal 18, the amplification circuit 12 amplifies the RF input signal 16 in accordance to an amplification gain. For example, if the amplification gain of the amplification circuit 12 is represented by β and is constant, then the RF output signal 18 may take the basic form of the RF input signal 16 after its values have been scaled in accordance with the amplification gain, β. On the other hand, if the amplification gain of the amplification circuit 12 varies, the form of the RF output signal 18 may not take the same form as the RF input signal 16. The form of the RF output signal 18 may also be different from the RF input signal 16 based on, for example, the frequency response characteristics the RF amplification device 10. The amplification circuit 12 may be any type of amplification circuit 12 such as, for example, a transistor, or any combination of transistors, an op-amp, a power amplifier, a voltage amplifier, a current amplifier, a distributed amplifier, a microwave amplifier, and/or the like.

The quiescent operating level of the RF output signal 18 is the signal level of the RF output signal 18 when no RF input signal 16 is received by the amplification circuit 12 or when the RF input signal 16 has a signal level of zero. The quiescent operating level of the RF output signal 18 is set by the bias signal level of the bias signal 20 from the bias circuit 14. The quiescent operating level is applied to the RF input signal 16 so that the RF input signal 16 is level shifted within the operating range of the amplification circuit 12. The bias signal 20 may be a DC signal so that the bias signal level is constant or substantially constant. In other embodiments, there may be designed variations in the bias signal level. This of course may depend on the type and the application for the RF amplification device 10.

The bias circuit 14 is operable to generate the bias signal 20 in an adjustment enable mode and in an adjustment disable mode. When the bias circuit 14 is operating in the adjustment enable mode, the bias circuit 14 is configured to adjust the bias signal level of the bias signal 20 such that the quiescent operating level of the RF output signal 18 is set to a reference signal level. In contrast, when the bias circuit 14 is operating in the adjustment disable mode, the bias circuit 14 is configured to maintain the bias signal level of the bias signal 20. Since the bias signal level of the bias signal is adjusted to set the quiescent operating level to a reference signal level during the adjustment enable mode, the quiescent operating level can be adjusted to compensate for drift. Additionally, the quiescent operating level can be adjusted during the adjustment enable mode to reduce or eliminate variations in the quiescent operating level due to manufacturing aberrations.

In the embodiment illustrated in FIG. 1, a feedback signal 22 is received by the bias circuit 14. The feedback signal 22 has a feedback signal level that is indicative of the quiescent operating level of the RF output signal 18. The feedback signal 22 may be received from the amplification circuit 12. Alternatively, the feedback signal 22 may be received from another circuit, such as a voltage regulation circuit, which is explained in further detail below. In the adjustment enable mode, the bias circuit 14 may adjust the quiescent operating level based on the feedback signal level of the feedback signal 22 until the quiescent operating level is provided at the reference signal level. However, in the adjustment disable mode, the bias circuit 14 may maintain the bias signal level of the bias signal 20 such that the bias circuit 14 is unresponsive to the feedback signal 22.

Figure 2A:
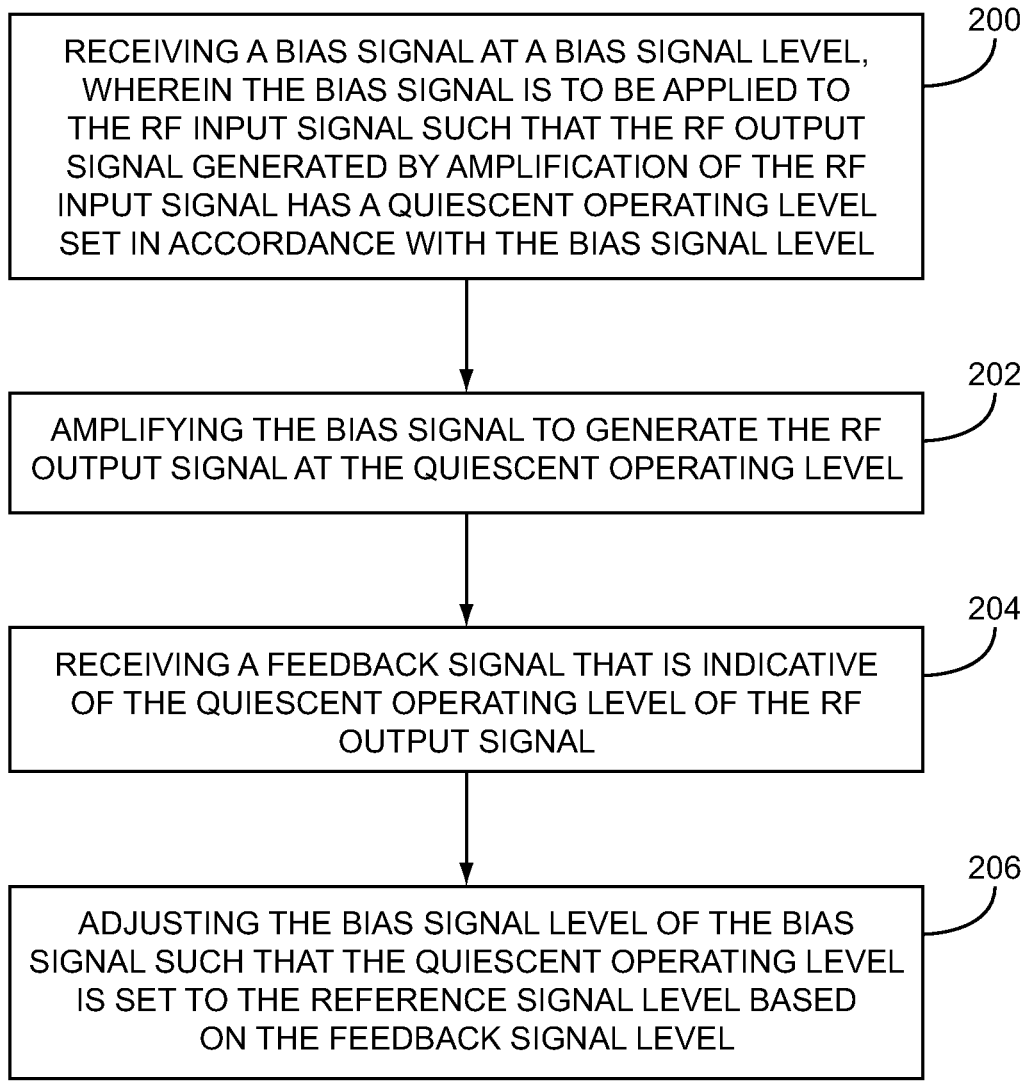
FIG. 2A-2B illustrate exemplary procedures that may be implemented to provide a quiescent operating level to an RF output signal generated from the RF amplification device shown in FIG. 1.

Referring now to FIG. 1 and FIG. 2A, FIG. 2A illustrates exemplary procedures of providing the quiescent operating level of the RF output signal 18. Each of the exemplary procedures discussed in FIG. 2A is performed prior to amplifying the RF input signal 16. The exemplary procedures may be performed by the RF amplification device 10 shown in FIG. 1. To begin, the amplification circuit 12 receives the bias signal 20 at the bias signal level, wherein the bias signal 20 is to be applied to the RF input signal 16 such that the RF output signal 18 generated by amplification of the RF input signal 16 has a quiescent operating level set in accordance with the bias signal level (procedure 200). In other words, the bias signal 20 that is used to provide the quiescent operating level of the RF output signal 18 is received before the RF input signal 16 is received for amplification.

Next, the amplification circuit 12 amplifies the bias signal 20 to generate the RF output signal 18 at the quiescent operating level (procedure 202). Accordingly, since the RF input signal 16 is not being amplified but rather just the bias signal 20, the output from the amplification circuit 12 directly indicates the quiescent operating level. Prior to amplifying the RF input signal 16, the RF amplification device 10 shown in FIG. 1 is in the adjustment enable mode when the RF output signal 18 is at the quiescent operating level. As such, the bias circuit 14 receives the feedback signal 22 indicative of the quiescent operating level of the RF output signal 18 (procedure 204). Since prior to amplifying the RF input signal 16, the only signal component received by the amplification circuit 12 is the bias signal 20, the RF output signal 18 is directly placed at the quiescent operating level. In response, the bias circuit 14 adjusts the bias signal level of the bias signal 20 such that the quiescent operating level is set to the reference signal level based on the feedback signal level (procedure 206). In this manner, the quiescent operating level of the RF output signal 18 is set prior to amplifying the RF input signal 16.

Figure 2B:
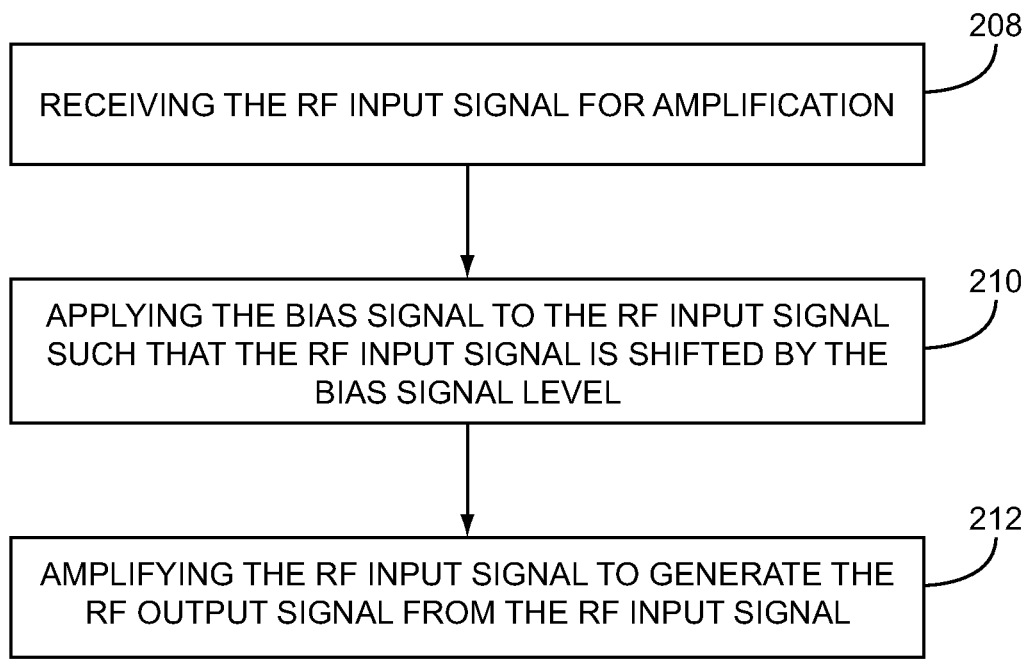

Referring now to FIGS. 1 and 2B, FIG. 2B illustrates exemplary procedures that may each be implemented after adjusting the bias signal level of the bias signal 20. In this example, the RF amplification device 10 operates in the adjustment disable mode after adjusting the bias signal level of the bias signal 20. Once the quiescent operating level of the RF output signal 18 has been adjusted, the amplification circuit 12 receives RF input signal 16 (procedure 208). As a result, the bias signal 20 is applied to the RF input signal 16 such that the RF input signal 16 is shifted by the bias signal level (procedure 210). As such, the bias signal 20 places the RF input signal 16 within the operating range of the amplification circuit 12. The amplification circuit 12 then amplifies the RF input signal 16 to generate the RF output signal 18 from the RF input signal 16 (procedure 212). Since the RF amplification device 10 is in the adjustment disable mode, the bias circuit 14 holds the bias signal level as set after adjusting the bias signal level. The bias circuit 14 thus maintains the bias signal level of the bias signal 20.

Figure 3:
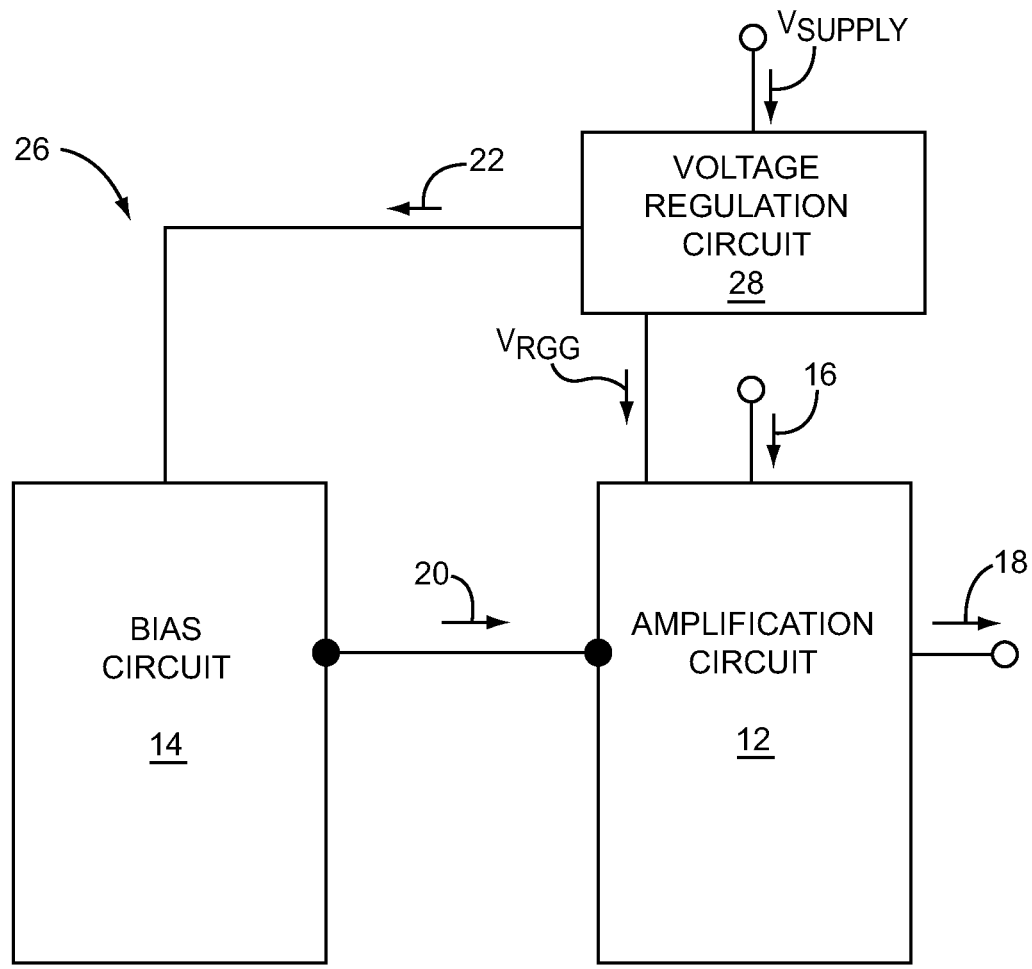
FIG. 3 illustrates a block diagram of another embodiment of the RF amplification device.

FIG. 3 illustrates a block diagram of another embodiment of a RF amplification device 26. The RF amplification device 26 is similar to the RF amplification device 10 shown in FIG. 1. However, the RF amplification device 26 shown in FIG. 3 also includes a voltage regulation circuit 28. The voltage regulation circuit 28 receives a supply voltage $V_{SUPPLY}$ and is configured to generate a regulated voltage $V_{REG}$ from the supply voltage $V_{SUPPLY}$. To generate the RF output signal 18, the amplification circuit 12 is operably associated with the voltage regulation circuit 28 such that amplification of the RF input signal 16 is driven by the regulated voltage $V_{REG}$. So long as the voltage regulation circuit 28 is not saturated, the voltage regulation circuit 28 can provide the regulated voltage $V_{REG}$ so that the regulated voltage $V_{REG}$ has a regulated voltage level. Accordingly, the regulated voltage level of the regulated voltage $V_{REG}$ is provided relatively steady despite glitches and sudden changes in the supply voltage $V_{SUPPLY}$. The amplification circuit 12 is operably associated with the voltage regulation circuit 28 such that the amplification gain of the amplification circuit 12 is adjusted by the regulated voltage level of the regulated voltage $V_{REG}$. In other words, as the regulated voltage level of the regulated voltage $V_{REG}$ varies so does the amplification gain of the amplification circuit 12.

In this embodiment, the bias circuit 14 is operably associated with the voltage regulation circuit 28 such that the feedback signal 22 at the feedback signal level is received by the bias circuit 14 from the voltage regulation circuit 28. The bias circuit 14 shown in FIG. 3 is directly coupled to the voltage regulation circuit 28. Alternatively, other feedback circuits and/or attenuation circuits may be coupled between the voltage regulation circuit 28 and bias circuit 14. These feedback circuit and/or attenuation circuits may provide a desired transfer function for feedback. Prior to amplifying the RF input signal 16, the feedback signal level of the feedback signal 22 is indicative of the quiescent operating level of the RF output signal 18. As explained above, when the bias circuit 14 is operating in the adjustment enable mode, the bias circuit 14 is configured to adjust the bias signal level of the bias signal 20. The quiescent operating level is set to the reference signal level by adjusting the quiescent operating level based on the feedback signal level until the quiescent operating level is provided at the reference signal level.

The bias circuit 14 shown in FIG. 3 is configured to adjust the bias signal level of the bias signal 20 such that the quiescent operating level is a quiescent operating current level and the reference signal level is a reference current level. The voltage regulation circuit 28 sets the regulated voltage level of the regulated voltage $V_{REG}$ at a desired voltage level. In turn, this sets the voltage level of the RF output signal 18. However, the quiescent operating current level of the RF output signal 18 may drift or may not be set to the desired reference current level. As such, the bias circuit 14 adjusts the quiescent operating current level to the reference current level based on the feedback signal level of the feedback signal 22.

Figure 4:
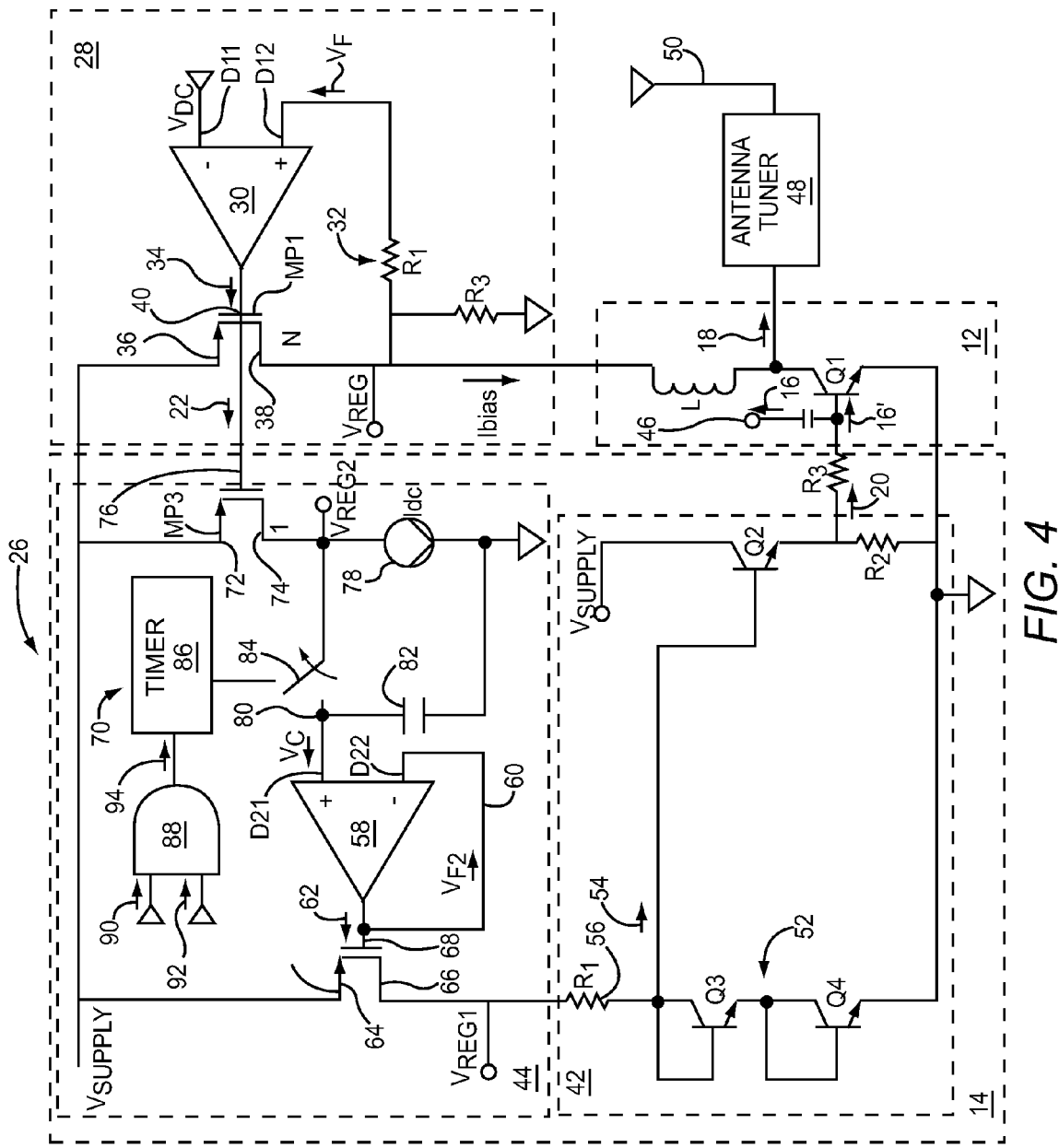
FIG. 4 illustrates a circuit diagram of one embodiment of the RF amplification device shown in FIG. 3.

FIG. 4 illustrates an exemplary circuit diagram of one embodiment of the RF amplification device 26 shown in FIG. 3. The voltage regulation circuit 28 has a differential amplifier 30, a voltage regulator MP1, and a feedback circuit 32. During a transmission burst, the voltage regulation circuit 28 receives a voltage control signal which in this example is a voltage $V_{DC}$. This voltage control signal $V_{DC}$ may be designed so that the regulated voltage level of the regulated voltage $V_{REG}$ sets the amplification gain of the amplification circuit 12 in order for the RF input signal 16 to comply with a burst mask specified for a timeslot. The voltage control signal $V_{DC}$ in this example is a DC voltage and RF input signal 16 is assumed to be an EDGE signal. In this embodiment, a feedback signal $V_F$ is also provided to the voltage regulation circuit 28. The voltage regulation circuit 28 has a voltage adjustment gain. The voltage adjustment gain may be described as the amount of adjustment of the regulated voltage level of the regulated voltage $V_{REG}$ divided by a first voltage difference between the voltage control signal level of the voltage control signal $V_{DC}$ and the feedback signal level of the feedback signal $V_F$. There are other ways of describing the voltage adjustment gain. In essence, the voltage adjustment gain is a measure of how much the regulated voltage level of the regulated voltage $V_{REG}$ changes as a result of a first voltage difference between the voltage control signal level and the feedback signal level. Accordingly, as the voltage control signal of the feedback signal $V_F$ changes, so does the regulated voltage level of the regulated $V_{REG}$.

In the embodiment illustrated in FIG. 4, the differential amplifier 30 is configured to receive the voltage control signal $V_{DC}$ and the feedback signal $V_F$ at differential amplifier input terminals D11 and D12, respectively. The differential amplifier 30 is operable to generate a voltage regulator control signal 34 that is received by the voltage regulator MP1. The regulated voltage level of the regulated voltage $V_{REG}$ may be set in accordance with a voltage regulator control signal level of the voltage regulator control signal 34. The differential amplifier 30 of FIG. 4 is configured to drive the feedback signal level of the feedback signal $V_F$ to be approximately equal to the voltage control signal level of the voltage control signal $V_{DC}$. When there is the first voltage difference between the voltage control signal level of the voltage control signal $V_{DC}$ and the feedback signal level of the feedback signal is zero, the differential amplifier 30 maintains the voltage regulator control signal level of the voltage regulator control signal 34 essentially constant. However, when the first voltage difference is not zero, the differential amplifier 30 generates the voltage regulator control signal 34 such that the voltage regulator control signal level adjust the regulated voltage level in accordance with the voltage adjustment gain of the voltage regulation circuit 28 and the first voltage difference between the voltage control signal level of the voltage control signal $V_{DC}$ and the feedback signal level of the feedback signal $V_F$.

As shown in FIG. 4, the voltage regulator MP1 is configured to receive the voltage regulator control signal 34 and generate the regulated voltage $V_{REG}$ from the supply voltage $V_{SUPPLY}$. The voltage regulator MP1 sets the regulated voltage level of the regulated voltage $V_{REG}$ in accordance with the voltage regulator control signal level of the voltage regulator control signal 34. The voltage regulation circuit 28 shown in FIG. 4 is configured as a low-drop-out (LDO) voltage regulation circuit. The voltage regulator MP1 is a first field effect transistor (FET) having a first FET input terminal 36, a first FET output terminal 38, and a first FET control terminal 40. The first FET is a P-type FET and thus the first FET input terminal 36 is a source terminal, the first FET output terminal 38 is a drain terminal, and the first FET control terminal 40 is a gate terminal. The first FET input terminal 36 is coupled to receive the supply voltage $V_{SUPPLY}$ while the first FET output terminal 38 is configured to output the regulated voltage $V_{REG}$. This regulated voltage $V_{REG}$ is provided to the amplification circuit 12. The voltage regulator MP1 has the first FET control terminal 40 coupled with the differential amplifier 30 so that the first FET control terminal 40 receives the voltage regulator control signal 34 from the differential amplifier 30. Since the first FET control terminal 40 is a gate terminal, the voltage regulator MP1 generates the regulated voltage $V_{REG}$ at the first FET output terminal 38 (the drain terminal in this embodiment) where the regulated voltage level of the regulated voltage $V_{REG}$ is set by the voltage regulator MP1 in accordance with the voltage regulator control signal level of the voltage regulator control signal 34 received from the differential amplifier 30.

The voltage regulator MP1 regulates the regulated voltage level so that variations in the supply voltage level of the supply voltage $V_{SUPPLY}$ do not significantly affect the regulated voltage level. However, the voltage regulator MP1 can only regulate the regulated voltage level so long as the voltage regulator MP1 is not saturated. As such, the voltage regulator MP1 has a drop-out voltage level which is a minimum voltage difference required between the supply voltage level of the supply voltage $V_{SUPPLY}$ and the regulated voltage level of the regulated voltage $V_{REG}$ so that the voltage regulator MP1 regulates the regulated voltage $V_{REG}$. Since the voltage regulation circuit 28 is configured as a LDO voltage regulation circuit, the drop-out voltage level is simply the saturation voltage level of the P-type FET. It should be noted that in alternative embodiments, the voltage regulation circuit 28 may be configured as a different type of voltage regulation circuit such as a standard voltage regulation circuit or a quasi LDO circuit. While not required, the LDO circuit configuration is generally preferable because the LDO circuit configuration tends to have the lowest drop-out voltage level and therefore can provide better power efficiency.

Referring again to FIG. 4, the voltage regulation circuit 28 includes the feedback circuit 32, which is coupled so as to generate the feedback signal $V_F$ from the regulated voltage $V_{REG}$. As previously discussed, the differential amplifier 30 may be configured to drive the voltage regulator MP1 so that the feedback signal level of the feedback signal $V_F$ is approximately equal to the voltage control signal level of the voltage control signal $V_{DC}$. As a result, this causes the regulated voltage level of the regulated voltage $V_{REG}$ to be adjusted. The amount of adjustment of the regulated voltage level of the regulated voltage $V_{REG}$ thus depends on the amount of adjustment of the regulated voltage level is required so as to drive the feedback signal level of the feedback signal $V_F$ so that the feedback signal level is approximately equal to the voltage control signal level of the voltage control signal $V_{DC}$. Accordingly, the feedback circuit 32 is coupled so as to set the voltage adjustment gain of the voltage regulation circuit 28.

As shown in FIG. 4, the bias circuit 14 includes a bias signal generation circuit 42 and a voltage regulation circuit 44. The bias signal generation circuit 42 is coupled to the amplification circuit 12 and generates the bias signal 20. The bias signal 20 is applied to the RF input signal 16 and thus, the RF input signal 16 is shifted by the bias signal level of the bias signal 20. The RF input signal 16 is then amplified by the amplification circuit 12 in accordance with the gain of the amplification circuit 12 to generate the RF output signal 18. In this example, amplification is provided by the transistor, Q1, which is a Heterojunction Bipolar Transistor (HBT). However, any suitable transistor type may be used, such as without limitation, any suitable bipolar junction transistors (BJT) or field effect transistor (FET). In this embodiment, the base terminal of the transistor Q1 is connected to the bias signal generation circuit 42 and to the input terminal 46. The bias signal 20 and the RF input signal 16 are combined at the base terminal of the transistor Q1 so as to provide the RF input signal 16' so that it is biased in accordance with the bias signal level of the bias signal 20. This bias signal level of the bias signal 20 may thus shift the RF input signal 16 by bias signal level to provide the RF input signal 16'. Accordingly, the quiescent operating level of the RF output signal 18 is set by the bias signal level of the bias signal 20 because the quiescent operating level of the RF output signal 18 is the level of the RF output signal 18 when no RF input signal 16 is being received by the amplification circuit 12. As a result, the RF output signal 18 is at the quiescent operating level when the RF input signal 16 is zero so that the only component of the RF input signal 16' is the bias signal 20.

The collector terminal of the transistor Q1 is coupled to receive the regulated voltage, $V_{REG}$, from the voltage regulation circuit 28. The regulated voltage, $V_{REG}$ provides the necessary energy for the transistor Q1 to amplify the RF input signal 16' which has been biased by the bias signal 20. The emitter terminal of the transistor Q1 is coupled to ground. The RF output signal 18 in this embodiment is at the collector terminal. The RF amplification device 26 is coupled to output the RF output signal 18 to an antenna tuner 48 for transmission of the RF output signal 18 by an antenna 50. The antenna tuner 48 may provide impedance matching to improve the power efficiency of the RF amplification device 26.

The bias signal generation circuit 42 includes a biasing regulation circuit 52 and a transistor Q2. The biasing regulation circuit 52 receives another regulated voltage $V_{REG1}$ at a regulated voltage level from the voltage regulation circuit 44 and outputs a bias level input signal 54 that is received by the transistor Q2. The bias signal generation circuit 42 is configured to generate the bias signal 20 based on the regulated voltage level of the regulated voltage $V_{REG1}$. In this example, the transistor Q2 generates the bias signal 20 based on the bias level input signal 54. Since a bias level input signal level of the bias level input signal 54 is set in accordance with the regulated voltage level of the regulated voltage $V_{REG1}$, the bias signal level of the bias signal 20 can be controlled by adjusting the regulated voltage level (and thus the bias level input signal level).

The biasing regulation circuit 52 includes a pair of transistors Q3, Q4 which are coupled to receive the regulated voltage, $V_{REG1}$ from the voltage regulation circuit 44. Each of the transistors Q3, Q4 is a HBT having its base terminal coupled to its collector terminal. Thus, transistors Q3, Q4 operate as diodes and prevent any current from reaching ground. However, these transistors Q3, Q4 do consume a voltage from the base terminals to the emitter terminals. Thus, the bias level input signal level of the bias level input signal 54 can be maintained relatively stable. If there are any sudden increases in the regulation voltage, $V_{REG1}$, the additional voltage will be consumed by the transistors Q3, Q4 to soften changes in the current level of the bias level input signal 54. Also, if transistors Q2, Q3, and Q4 are similar transistors, then the voltage level of the bias level input signal 54 may be around the same as the base to the emitter voltage of one of the transistors Q2, Q3, and Q4. Referring again to FIG. 4, the quiescent current level of the RF output signal 18 is represented in FIG. 4 by $I_{bias}$. The quiescent current level of the RF output signal 18 in the transistor Q1 is approximately given by Equation (1):

$$I_{bias} = \frac{V_{REG1} - V_{be3} - V_{be4}}{R1} * M$$

The value M is a device ratio between the transistor Q4 and the transistor Q1. $V_{be3}$ and $V_{be4}$ are the base to emitter voltages of the transistors Q3 and Q4, respectively. The value R1 is the resistance value of a resistor 56.

The voltage regulation circuit 44 is operable to compensate for variations in the base to emitter voltages $V_{be3}, V_{be4}$ due to variations resulting from drift as the transistors Q3, Q4 heat up temperature coefficients. However, if the temperature coefficient of $V_{REG1}$ is not matched with $V_{be3}, V_{be4}$ temperature coefficient (which is may be the case due to manufacturing anomalies), the $I_{bias}$ may vary in different manufactured RF amplification devices 26. The quiescent current level $I_{bias}$ also varies with variation of the gain β and the transistors Q1-Q4 and the resistance value R1. This variation of quiescent current level $I_{bias}$ will cause variations in the output power and power added efficiency (PAE), which will affect the final yield of the RF amplification device 26.

To compensate for, reduce, and/or prevent variations due to temperature drift and/or from manufacturing anomalies, the voltage regulation circuit 44 is operable in the adjustment enable mode and in the adjustment disable mode to generate the regulated voltage $V_{REG1}$. In the adjustment enable mode, the voltage regulation circuit 44 is configured to adjust the bias signal level of the bias signal 20 such that the quiescent current level, $I_{bias}$, is set to the reference current level by adjusting the quiescent current level based on the feedback signal level of the feedback signal 22 until the quiescent current level is provided at the reference current level. Once the bias signal level of the bias signal 20 has been set, the bias circuit 14 operates in the adjustment disable mode. In the adjustment disable mode, the voltage regulation circuit 44 is configured to maintain the bias signal level of the bias signal 20 by holding the regulated voltage level of the regulated voltage $V_{REG1}$ as provided during the adjustment enable mode.

FIG. 4 illustrates an exemplary circuit diagram of one embodiment of the voltage regulation circuit 44. The voltage regulation circuit 44 has a differential amplifier 58, a voltage regulator MP2, and a feedback path 60. To generate the regulated voltage $V_{REG1}$, the differential amplifier 58 receives a voltage control signal which in this example is a voltage $V_c$. This voltage control signal $V_c$ may be designed so that the regulated voltage level of the regulated voltage $V_{REG1}$ sets the bias signal level of the bias signal 20. In this embodiment, a feedback signal $V_{F2}$ is also provided to the differential amplifier 58 from the feedback path 60.

In the embodiment illustrated in FIG. 4, the differential amplifier 58 is configured to receive the voltage control signal $V_c$ and the feedback signal $V_{F2}$ at the differential amplifier terminals D21, D22 respectively. The differential amplifier 58 is operable to generate a voltage regulator control signal 62 that is received by the voltage regulator MP2. The regulated voltage level of the regulated voltage $V_{REG}$ may be set in accordance with a voltage regulator control signal level of the voltage regulator control signal 34. The differential amplifier 58 in the voltage regulation circuit 44 is configured to drive the feedback signal level of the feedback signal $V_{F1}$ to be approximately equal to the voltage control signal level of the voltage control signal $V_c$. When there is the voltage difference between the voltage control signal level of the voltage control signal $V_c$ and the feedback signal level of the feedback signal $V_{F1}$ is zero, the differential amplifier 30 maintains the voltage regulator control signal level of the voltage regulator control signal 62 essentially constant. However, when the voltage difference is not zero, the differential amplifier 58 generates the voltage regulator control signal 62 such that the voltage regulator control signal level adjust the regulated voltage level of the regulated voltage $V_{REG1}$ in accordance with the voltage adjustment gain of the voltage regulation circuit 44 and the voltage difference between the voltage control signal level of the voltage control signal $V_c$ and the feedback signal level of the feedback signal $V_{F1}$.

As shown in FIG. 4, the voltage regulator MP2 is configured to receive the voltage regulator control signal 62 and generate the regulated voltage $V_{REG1}$ from the supply voltage $V_{SUPPLY}$. The voltage regulator MP2 sets the regulated voltage level of the regulated voltage $V_{REG1}$ in accordance with the voltage regulator control signal level of the voltage regulator control signal 62. The voltage regulation circuit 44 shown in FIG. 4 is configured as a LDO voltage regulation circuit. The voltage regulator MP2 is a FET having a FET input terminal 64, a FET output terminal 66, and a FET control terminal 68.

The FET is a P-type FET and thus the FET input terminal 64 is a source terminal, the FET output terminal 66 is a drain terminal, and the FET control terminal 68 is a gate terminal. The FET input terminal 64 is coupled to receive the supply voltage $V_{SUPPLY}$ while the FET output terminal 66 is configured to output the regulated voltage $V_{REG1}$. This regulated voltage $V_{REG1}$ is provided to the bias signal generation circuit 42. The voltage regulator MP2 has the FET control terminal 68 coupled with the differential amplifier 58 so that the FET control terminal 68 receives the voltage regulator control signal 62 from the differential amplifier 58. Since the FET control terminal 68 is a gate terminal, the voltage regulator MP2 generates the regulated voltage $V_{REG1}$ at the FET output terminal 66 (the drain terminal in this embodiment) where the regulated voltage level of the regulated voltage $V_{REG1}$ is set by the voltage regulator MP2 in accordance with the voltage regulator control signal level of the voltage regulator control signal 62 received from the differential amplifier 58.

The voltage regulator MP2 regulates the regulated voltage level so that variations in the supply voltage level of the supply voltage $V_{SUPPLY}$ do not significantly affect the regulated voltage level. However, the voltage regulator MP2 can only regulate the regulated voltage level so long as the voltage regulator MP2 is not saturated. As such, the voltage regulator MP2 has a drop-out voltage level which is a minimum voltage difference required between the supply voltage level of the supply voltage $V_{SUPPLY}$ and the regulated voltage level of the regulated voltage $V_{REG}$ so that the voltage regulator MP2 regulates the regulated voltage $V_{REG1}$. Since the voltage regulation circuit 44 is configured as a LDO voltage regulation circuit, the drop-out voltage level is simply the saturation voltage level of the P-type FET. It should be noted that in alternative embodiments, the voltage regulation circuit 28 may be configured as a different type of voltage regulation circuit such as a standard voltage regulation circuit or a quasi LDO circuit. While not required, the LDO circuit configuration is generally preferable because the LDO circuit configuration tends to have the lowest drop-out voltage level and therefore can provide better power efficiency.

Referring again to FIG. 4, the voltage regulation circuit 44 includes the feedback path 60, which is coupled so as to generate the feedback signal $V_{F2}$ from the regulated voltage $V_{REG1}$. The differential amplifier 58 may be configured to drive the voltage regulator MP2 so that the feedback signal level of the feedback signal $V_{F2}$ is approximately equal to the voltage control signal level of the voltage control signal $V_c$. Prior to amplifying the RF input signal 16, this causes the regulated voltage level of the regulated voltage $V_{REG1}$ to be adjusted and thereby adjusts the bias signal level of the bias signal 20. The amount of adjustment of the regulated voltage level of the regulated voltage $V_{REG1}$ thus depends on the amount of adjustment of the regulated voltage level is required so as to drive the feedback signal level of the feedback signal $V_{F2}$ so that the feedback signal level is approximately equal to the voltage control signal level of the voltage control signal $V_c$. By adjusting the bias signal level of the bias signal 20, the quiescent current level $I_{bias}$ of the RF output signal can be maintained at the desired reference current level in the adjustment disable mode.

To place the voltage regulation circuit 44 in the adjustment enable mode and in the adjustment disable mode, the voltage regulation circuit 44 includes a sample and hold circuit (SHC) 70 and another voltage regulator MP3. The voltage regulator MP3 is another FET that includes a FET input terminal 72, a FET output terminal 74, and a FET control terminal 76. Since the voltage regulator MP3 is another P-type FET, the FET input terminal 72 is a drain terminal, the FET output terminal 74 is a source terminal, and the FET control terminal 76 is a gate terminal. The voltage regulator MP3 is configured to receive the supply voltage, $V_{SUPPLY}$, and generate a regulated voltage $V_{REG2}$ at a regulated voltage level from the supply voltage, $V_{SUPPLY}$.

The SHC 70 is operable to receive a control voltage at a control voltage level from the voltage regulator MP3. The voltage regulator MP3 generates the control voltage in accordance with the feedback signal level of the feedback signal 22. In this example, the feedback signal 22 is received as the voltage regulator control signal 34 from the differential amplifier 30. As discussed above, the voltage regulator control signal 34 is used to set the regulated voltage, $V_{REG}$, of the voltage regulation circuit 28. A current source 78 generates a reference current at a reference current level, $I_{dc}$. The current source 78 is operably associated with the voltage regulator MP3 such that the reference current sets a current level of the control voltage from the voltage regulator MP3. Prior to amplifying the RF input signal 16, the feedback signal 22 is indicative of the quiescent current level, $I_{bias}$. In the embodiment shown in FIG. 4, the current source 78 is directly coupled to the FET output terminal 74. The quiescent current level, $I_{bias}$, is approximately set to the reference current level. If the effect of the feedback circuit 32 is ignored, the reference current level can be expressed in accordance with Equation (2):

$$I_{bias} = I_{dc} * N$$

N is a device ratio between the voltage regulator MP1 and the voltage regulator MP3. The SHC 70 is operably associated with the voltage regulator MP3 such that the voltage regulator control signal level of the voltage regulator control signal 62 is set in accordance with the voltage control signal level of the voltage control signal $V_c$, which in this example is the control voltage. The voltage regulator MP3 is configured to generate the voltage control signal $V_c$ as the regulated voltage $V_{REG2}$ and provide the voltage control signal $V_c$ to the differential amplifier 58. In the embodiment shown in FIG. 4, the voltage control signal $V_c$ is the control voltage and thus the voltage control signal $V_c$ is generated by the voltage regulator MP3 from the regulated voltage $V_{REG2}$. The voltage control signal $V_c$ is adjusted based on the regulated voltage level of the regulated voltage $V_{REG2}$. In turn, the regulated voltage level of the regulated voltage $V_{REG2}$ is set in accordance with the feedback signal level of the feedback signal 22.

However, the SHC 70 is configured to sample the regulated voltage $V_{REG2}$ in the adjustment enable mode to adjust the voltage regulator control signal level of the voltage regulator control signal 62 in accordance with the regulated voltage level of the regulated voltage $V_{REG2}$. In the adjustment disable mode, the SHC 70 holds the voltage control signal level of the voltage control signal $V_c$. To do this, the SHC 70 shown in FIG. 4 has a storage node 80, a charge holding element 82, and a switch 84 coupled to the storage node 80 that receives the regulated voltage $V_{REG2}$ from the FET output terminal 74 of the voltage regulator MP3. The switch 84 is configured to be activated such that the regulated voltage $V_{REG2}$ is sampled at the storage node 80 to provide the voltage control signal $V_c$. If the regulated voltage level of the regulated voltage $V_{REG2}$ has changed, so does the voltage control signal level of the voltage control signal $V_c$. As a result, the bias signal level of the bias signal 20 is adjusted such that the quiescent current level is equal to approximately $I_{dc}*N$.

The regulated voltage $V_{REG2}$ is sampled at the storage node 80 by charging the charge holding element 82 with the regulated voltage $V_{REG2}$ in the adjustment enable mode. In this example, the charge holding element 82 is a capacitor. In contrast, the switch 84 is deactivated in the adjustment disable mode. Accordingly, the voltage control signal level of the voltage control signal $V_c$, held by the charge holding element 82 when the SHC 70 is operating in the adjustment disable mode. In other words, the SHC 70 is opaque and is not changed by changes in the regulated voltage $V_{REG2}$ while the switch 84 is deactivated. As such, the voltage control signal level of the voltage control signal level of the voltage control signal $V_c$ is provided in the adjustment disable mode as set when the SHC 70 was transparent in the adjustment enable mode.

A timer 86 is operably associated with the switch 84 and is configured to activate the switch 84 for a time duration. After the time duration, the timer 86 deactivates the switch 84 to operate in the adjustment disable mode. In this embodiment, a logic gate 88 configured to receive a transmit enable signal 90 having an high signal state and a low signal state and a transmit mode signal 92 having a high signal state that indicates a first transmission mode and a low signal state that indicates a second transmission mode. The logic gate 88 in FIG. 4 is a AND gate, which activates the timer 86 and the switch 84 when the transmit enable signal 90 is in the high signal state and when the transmit mode signal 92 is in the high signal state. Thus, the high signal state is the activation signal state for both the transmit enable signal 90 and the transmit mode signal 92. However, in other embodiments, both or either the transmit enable signal 90 and the transmit mode signal 92 may be in the low signal state to provide the activation signal state depending on the logic used to activate the timer 86. When the transmit enable signal 90 is in the high signal state and the transmit mode signal 92 is in the high signal state, the logic gate 88 shown in FIG. 4 is configured to generate a switch enable signal 94. In response to the switch enable signal 94, the timer 86 is responsive to activate the switch 84.

During a ramp up period for an EDGE burst, the timer 86 is activated and the switch 84 is activated for the time duration. In one embodiment, the timer 86 shuts off after 5 qs. When the switch 84 opens up, the bias circuit 14 is in the adjustment disable mode and the voltage control signal level of the voltage control signal $V_c$ is stored on the charge storage element 82. The regulated voltage $V_{REG1}$ is held constant throughout the burst as the SHC 70 is opaque. Since the switch 84 is deactivated linearity and EVM of the RF amplification device 26 are not degraded.

Figure 5:
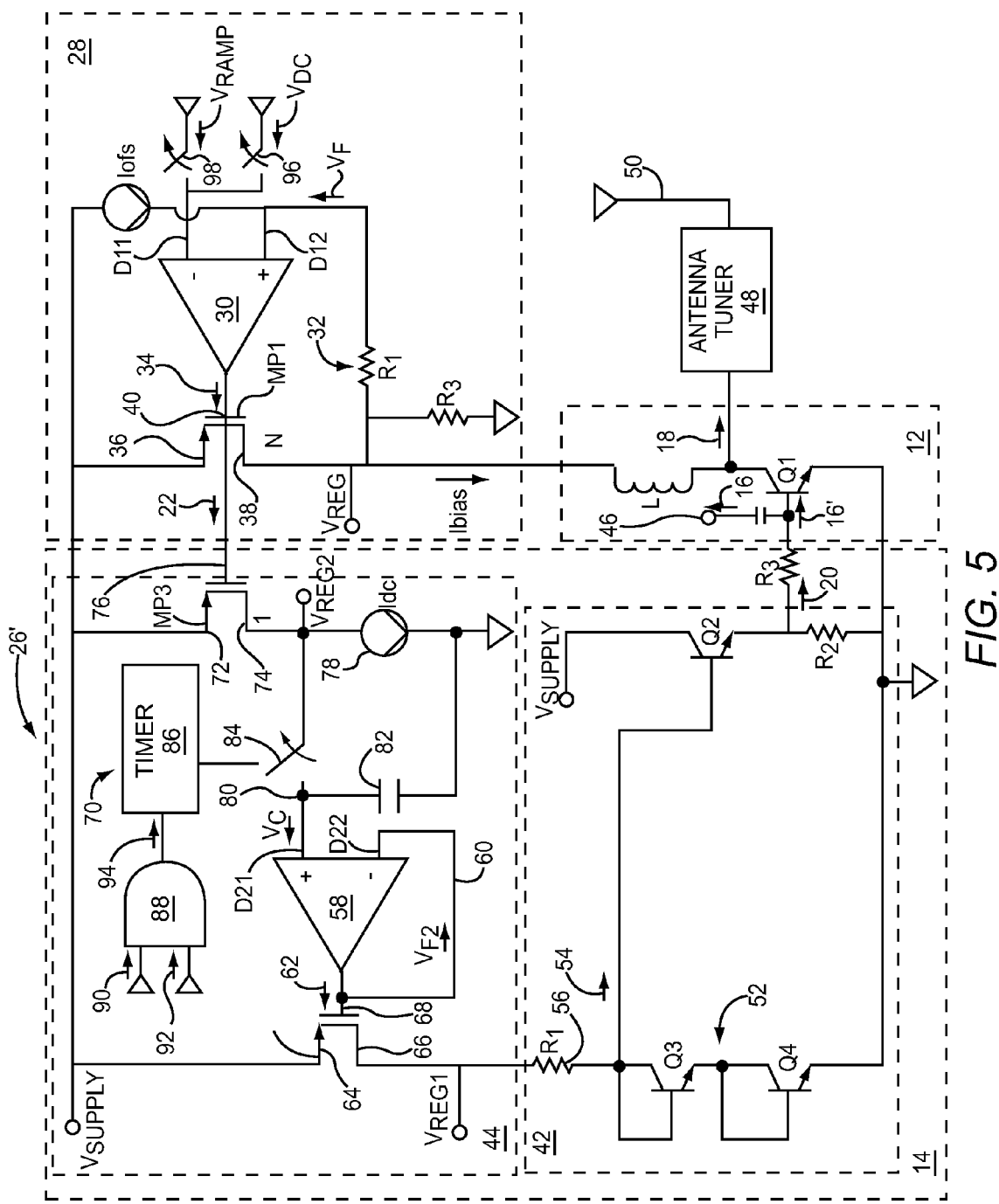
FIG. 5 illustrates a circuit diagram of another embodiment of the RF amplification device shown in FIG. 3.

FIG. 5 illustrates an exemplary circuit diagram of another embodiment of the RF amplification device 26' shown in FIG. 3. The RF amplification device 26' is similar to the RF amplification device 26 shown in FIG. 4. However, the RF amplification device 26' is operable to provide amplification when the RF input signal 16 is both an EDGE signal and a GSMK signal. If the RF input signal 16 is provided as the EDGE signal, a switch 98 is deactivated and a switch 96 is activated.

When the switch 96 is activated, the voltage control signal $V_{DC}$ is received and the RF amplification device 26' of FIG. 5 operates in the same manner as the RF amplification device 26 of FIG. 4.

In contrast, when the RF input signal 16 is the GSMK signal, the switches 96, 98 are enabled during different time durations. The switch 96 is coupled to the differential amplifier input terminal D11, so that a voltage control signal, $V_{DC}$ is receivable as the voltage control signal at the differential amplifier input terminal D11 when the switch 96 is enabled. Initially, the switch 96 is enabled while the switch 84 is enabled in the adjustment enable mode. As shown in FIG. 5, the switch 98 is coupled to the differential amplifier input terminal D11, so that a voltage control signal, $V_{RAMP}$ is receivable as the voltage control signal at the differential amplifier input terminal D11 when the switch 98 is enabled. After the time duration, the RF input signal 16 is received and the switch 84 is disabled in the adjustment disable mode. Additionally, the switches 84, 96 are disabled and the switch 98 is enabled to receive the $V_{RAMP}$ as the voltage control signal at the differential amplifier input terminal D11.

Figure 6:
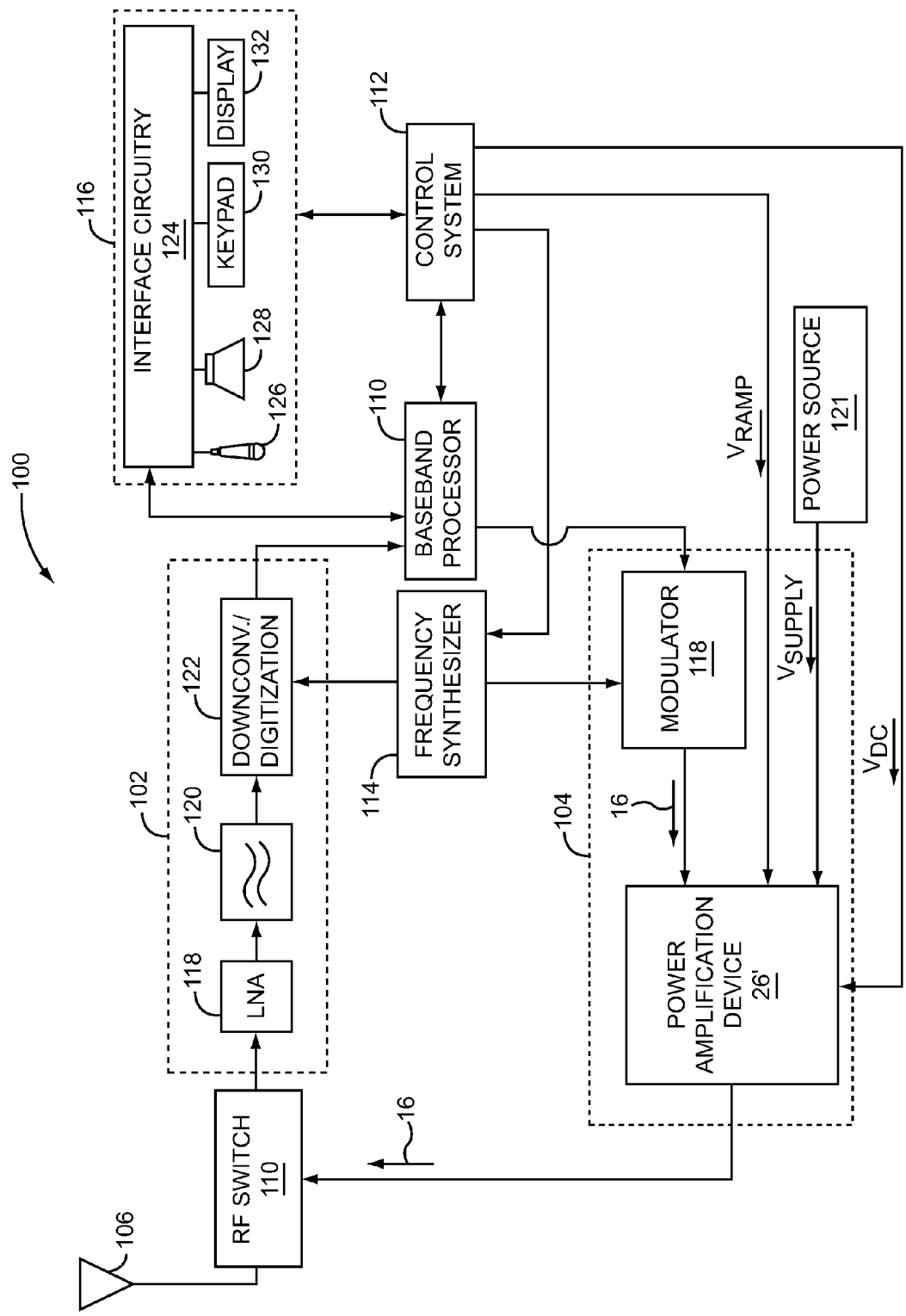
FIG. 6 illustrates one embodiment of a mobile communication device that incorporates the RF amplification device shown in FIG. 5 to amplify the RF input signal for transmission by an antenna.

With reference to FIG. 6, an embodiment of the RF amplification device 26' may be incorporated in a mobile communication device 100, such as a mobile cellular phone, personal digital assistant (PDA), and/or the like. The basic architecture of the mobile communication device 100 may include a receiver front end 102, a RF transmitter section 104, an antenna 106, a duplexer or RF switch 108, a baseband processor 110, a control system 112, a frequency synthesizer 114, and an interface 116. The receiver front end 102 receives information bearing RF signals from one or more remote transmitters provided by a base station. A low noise amplifier (LNA) 118 amplifies the RF receive signal. A filter circuit 120 minimizes broadband interference in the RF signal, while a down converter 122 down converts the filtered RF receive signal to an intermediate or baseband frequency signal, which is digitized to one or more digital streams. The receiver front end 102 typically uses one or more mixing frequencies generated by the frequency synthesizer 82.

The baseband processor 110 processes the digitized RF receive signal to extract the information or data that is conveyed in the RF receive signal. This processing typically comprises demodulation, decoding, and error corrections operations. As such, the baseband processor 110 is generally implemented in one or more digital signal processors (DSPs).

On the transmit side, the baseband processor 110 receives digitized data from the control system 112, which it encodes for transmission. The encoded data is output to the RF transmitter section 104, where it is used by a modulator 118 to modulate a carrier signal at a desired transmit frequency and thereby generate the RF input signal 16. The RF amplification device 10 amplifies the RF input signal 16 to a signal level appropriate for transmission from the antenna 106. Specifically, the RF amplification device 10 receives and amplifies the RF input signal 16 from the modulator 118 to provide the RF input signal 16 after amplification to the antenna 106.

As described in detail above, the RF amplification device 10 provides the amplification for the RF input signal 16 under the control of the voltage control signal $V_{RAMP}$, and the voltage control signal $V_{DC}$ which are generated by the control system 112. The supply voltage $V_{SUPPLY}$ is received from a power source 121 such as a battery or an AC-to-DC converter. Other signals, such as the transmit enable signal 90 (not shown in FIG. 6) and the transmit mode signal 92 (not shown in FIG. 6) may also be provided by the control system 112.

A user may interact with the mobile communication device 100 via the interface 116, which may include interface circuitry 124 associated with a microphone 126, a speaker 128, a keypad 130, and a display 132. Alternatively, the mobile communication device 100 may include a touch screen for interface with the user. The interface circuitry 124 typically includes analog-to-digital converters, digital-to-analog converters, amplifiers, and/or the like. Additionally, it may include a voice encoder/decoder, which may communicate directly with the baseband processor 110.

The microphone 126 will typically convert audio input, such as a user's voice, into an electrical signal which is digitized and passed directly or indirectly to the baseband processor 110. Audio information encoded in the receive signal is recovered by the baseband processor 110 and is converted into an analog suitable for driving the speaker 128. The keypad 130 and the display 132 enable the user to interact with the mobile communication device 100 by inputting numbers to be dialed, retrieving address book information, monitoring call progress information, and/or the like.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) amplification device, comprising:
    a voltage regulation circuit, comprising:
        a voltage regulator configured to:
            receive a supply voltage and a voltage regulator control signal at a voltage regulator control signal level; and
            generate a regulated voltage at a regulated voltage level from the supply voltage, wherein the regulated voltage level of the regulated voltage is set in accordance with the voltage regulator control signal level of the voltage regulator control signal; and
        a differential amplifier configured to generate the voltage regulator control signal, wherein the voltage regulator control signal level is indicative of a quiescent operating level;
    an amplification circuit configured to drive amplification of an RF input signal with the regulated voltage so as to generate an RF output signal from the RF input signal; and
    a bias circuit operable in an adjustment enable mode and in an adjustment disable mode so as to generate a bias signal at a bias signal level, the bias circuit being operably associated with the amplification circuit to apply the bias signal to the RF input signal such that the RF output signal has the quiescent operating level set in accordance with the bias signal level and the bias circuit is operably associated with the voltage regulation circuit such that the voltage regulator control signal is received by the bias circuit as a feedback signal, wherein the bias circuit is configured to:
        adjust the bias signal level of the bias signal such that the quiescent operating level is set to a reference signal level by adjusting the quiescent operating level based on the voltage regulator control signal level until the quiescent operating level is provided at the reference signal level when the bias circuit is operating in the adjustment enable mode; and
        maintain the bias signal level of the bias signal such that the bias circuit is unresponsive to the voltage regulator control signal when the bias circuit is operating in the adjustment disable mode.

2. The RF amplification device of claim 1, wherein the bias circuit is configured to adjust the bias signal level such that the quiescent operating level is a quiescent operating current level and the reference signal level is a reference current level.

3. The RF amplification device of claim 1, wherein the voltage regulation circuit further comprises:
the differential amplifier comprising a first differential amplifier input terminal configured to receive a voltage control signal, a second differential amplifier input terminal configured to receive the feedback signal, and a differential amplifier output terminal configured to output the voltage regulator control signal;
a first switch coupled to the first differential amplifier input terminal, wherein a first control signal is receivable as the voltage control signal at the first differential amplifier input terminal when the first switch is enabled; and
a second switch coupled to the first differential amplifier input terminal, wherein a second control signal is receivable as the voltage control signal at the first differential amplifier input terminal when the second switch is enabled.

4. The RF amplification device of claim 1, wherein the bias circuit further comprises:
a bias signal generation circuit configured to:
receive a second regulated voltage at a second regulated voltage level; and
generate the bias signal such that the bias signal level of the bias signal is based on the second regulated voltage level; and
a second voltage regulation circuit operable in the adjustment enable mode and in the adjustment disable mode to generate the second regulated voltage at the second regulated voltage level, the second voltage regulation circuit being configured to:
adjust the bias signal level of the bias signal in the adjustment enable mode by adjusting the second regulated voltage level of the second regulated voltage such that the bias signal generation circuit that sets the quiescent operating level to the reference signal level; and
maintain the bias signal level of the bias signal in the adjustment disable mode by holding the second regulated voltage level of the second regulated voltage as provided during the adjustment enable mode.

5. The RF amplification device of claim 4, wherein the second voltage regulation circuit comprises:
a second voltage regulator configured to:
receive the supply voltage and a second voltage regulator control signal at a second voltage regulator control signal level;
generate the second regulated voltage from the supply voltage, wherein the second regulated voltage level of the second regulated voltage is set in accordance with the second voltage regulator control signal level of the second voltage regulator control signal;
a sample and hold circuit (SHC) operable to receive a control voltage at a control voltage level, the SHC being operably associated with the second voltage regulator such that the second voltage regulator control signal level is set in accordance with the control voltage level of the control voltage wherein the SHC is configured to:
sample the control voltage in the adjustment enable mode to adjust the second voltage regulator control signal level based on the control voltage level; and
hold the control voltage level in the adjustment disable mode.

6. The RF amplification device of claim 5, wherein the SHC further comprises:
a storage node;
a charge holding element coupled to the storage node;
a switch coupled to the storage node and configured to receive the control voltage, wherein the switch is configured to be activated such that the control voltage is sampled at the storage node by charging the charge holding element with the control voltage in the adjustment enable mode and the switch is configured to be deactivated such that the control voltage is held at the storage node by the charge holding element in the adjustment disable mode.

7. The RF amplification device of claim 6, wherein the SHC further comprises:
a timer operably associated with the switch, wherein the timer is configured to:
activate the switch for a time duration to operate in the adjustment enable mode;
deactive the switch after the time duration to operate in the adjustment disable mode.

8. The RF amplification device of claim 7, wherein the SHC further comprises:
a logic gate configured to:
receive a transmit enable signal having an activation signal state and a deactivation signal state and a transmit mode signal having a first signal state that indicates a first transmission mode and a second signal state that indicates a second transmission mode;
generate a switch enable signal when the transmit enable signal is in the activation signal state and the transmit mode signal is in the first signal state;
the timer being responsive to activate the switch in response to the switch enable signal.

9. The RF amplification device of claim 5, wherein the second voltage regulation circuit comprises:
the second voltage regulator, wherein the second voltage regulator is configured to:
receive the supply voltage; and
generate the control voltage as the second regulated voltage from the supply voltage and provide the control voltage to the SHC; and
a current source that generates a reference current, wherein the current source is operably associated with the second voltage regulator such that the reference current sets a current level of the control voltage from the second voltage regulator.

10. The RF amplification device of claim 9, further comprising:
a third voltage regulation circuit comprising:
a third voltage regulator configured to:
receive the supply voltage and a third voltage regulator control signal at a third voltage regulator control signal level; and
generate a third regulated voltage at a third regulated voltage level from the supply voltage, wherein the third regulated voltage level of the third regulated voltage is set in accordance with the third voltage regulator control signal level of the third voltage regulator control signal; and
a second differential amplifier configured to generate the third voltage regulator control signal indicative of the quiescent operating level;
the third voltage regulator being operably associated with the second differential amplifier to receive a second feedback signal as the third voltage regulator control signal.

11. The RF amplification device of claim 10, wherein:
the second differential amplifier comprises a first differential amplifier input terminal configured to receive the third voltage regulator control signal, and a second differential amplifier input terminal configured to receive the second feedback signal as feedback from the third voltage regulator control signal.

12. The RF amplification device of claim 1, further comprising:
the amplification circuit configured to receive the RF input signal and the bias signal such that the bias signal is applied to the RF input signal thereby shifting the RF input signal by the bias signal level for amplification;
a control circuit configured to:
cause the bias circuit to operate in the adjustment enable mode while the RF input signal is not being received at a first terminal;
cause the bias circuit to operate in the adjustment disable mode after the RF input signal has been received at the first terminal.

13. A method of providing a quiescent operating level of an RF output signal generated by amplification of an RF input signal, comprising:
prior to amplifying the RF input signal, generating a voltage regulator control signal having a voltage regulator control signal level indicative of the quiescent operating level of the RF output signal;
prior to amplifying the RF input signal, receiving a supply voltage;
prior to amplifying the RF input signal, generating a regulated voltage at a regulated voltage level from the supply voltage such that the regulated voltage level of the regulated voltage is set in accordance with the voltage regulator control signal level of the voltage regulator control signal;
prior to amplifying the RF input signal, receiving a bias signal at a bias signal level, wherein the bias signal is to be applied to the RF input signal such that the RF output signal generated by amplification of the RF input signal has the quiescent operating level set in accordance with the bias signal level;
prior to amplifying the RF input signal, amplifying the bias signal to generate the RF output signal at the quiescent operating level;
prior to amplifying the RF input signal, receiving a feedback signal that is indicative of the quiescent operating level of the RF output signal, wherein the feedback signal is received as the voltage regulator control signal; and
prior to amplifying the RF input signal, adjusting the bias signal level of the bias signal such that the quiescent operating level is set to a reference signal level based on a feedback signal level.

14. The method of claim 13, further comprising:
after adjusting the bias signal level of the bias signal, receiving the RF input signal for amplification;
after adjusting the bias signal level of the bias signal, applying the bias signal to the RF input signal such that the RF input signal is shifted by the bias signal level; and
after adjusting the bias signal level of the bias signal, amplifying the RF input signal to generate the RF output signal from the RF input signal.

15. The method of claim 14, wherein amplifying the RF input signal to generate the RF output signal comprises:
holding the bias signal level as set after adjusting the bias signal level of the bias signal such that the quiescent operating level is set to the reference signal level.

16. The method of claim 13, wherein the quiescent operating level is a quiescent operating current level and the reference signal level is a reference current level.

* * * * *